United States Patent [19]

Garrigus

[11] Patent Number: 5,462,009
[45] Date of Patent: Oct. 31, 1995

[54] METHOD AND APPARATUS FOR PRODUCING PEROVSKITE COMPOSITIONS

[75] Inventor: Darryl F. Garrigus, Seattle, Wash.

[73] Assignee: The Boeing Company, Seattle, Wash.

[21] Appl. No.: 973,169

[22] Filed: Nov. 6, 1992

[51] Int. Cl.$^6$ ........................................ C30B 1/10
[52] U.S. Cl. ................... 117/7; 117/8; 501/137; 501/152
[58] Field of Search ................ 156/603, DIG. 73; 501/137, 152; 505/1; 117/7, 8, 947

[56] References Cited

U.S. PATENT DOCUMENTS

| | | | |
|---|---|---|---|
| 4,784,686 | 11/1988 | Meek et al. | 75/0.5 |
| 5,039,637 | 8/1991 | Hyuga et al. | 501/135 |
| 5,077,268 | 12/1991 | Clark et al. | 505/1 |
| 5,140,000 | 8/1992 | Tallon et al. | 505/1 |
| 5,145,830 | 9/1992 | Kohiki et al. | 505/1 |
| 5,204,031 | 4/1993 | Watanabe et al. | 501/135 |
| 5,206,214 | 4/1993 | Fujimori et al. | 505/1 |

OTHER PUBLICATIONS

Aliouat et al, "Microwave Sintering of Oxides", Mater. Res. Soc. Symp. Proc. vol. 189 1991 pp. 229–235 abs only.

Taguchi et al., Synthesis of Perovskite-Type $(La_{1-x}Sr_x)MnO_3$ ($0<x<0.3$) at Low Temperature, J. Am. Ceram. Soc. 75, 201–202.

Tai et al., Modified resin—intermediate processing of perovskite powder: Part I. Optimization of polymeric precursors, J. Mater. Res. vol. 7, No. 2, Feb. 1992.

Lessing, Mixed–Cation Oxide Powders via Polymeric Precursors Ceramic Bulletin vol. 68, No. 5, 1989, pp. 1002–1007.

Baythoun, Production of Strontium–substituted Lanthanum Manganite Perovskite Powder by the Amorphous Citrate Process Journ. of Materials Science 17 (1982) pp. 2757–2769.

Ono, Preparation of new Perovskite-type oxides $Ba_{2.5}Nb_{1.5}CuO_{7.25}$ and $Sr_3Ta_2CuO_9$, Nat. Inst. for Research in Inorganic Mat., pp. 114–115.

Metaxas et al., Advanced Ceramic Processing and Technology, Microwave Processing of Ceramics, pp. 343–355.

*Primary Examiner*—Robert Kunemund
*Attorney, Agent, or Firm*—Senniger, Powers, Leavitt & Roedel

[57] ABSTRACT

A method for producing a perovskite composition from a precursor composition wherein the precursor composition is irradiated with microwaves to heat the precursor composition and convert the precursor composition to perovskite. A susceptor crucible for use in processing a perovskite precursor composition. The susceptor crucible has an inner crucible, an outer crucible surrounding said inner crucible, and a susceptor material positioned between and separating the inner and outer crucibles.

17 Claims, 2 Drawing Sheets

METHOD AND APPARATUS FOR PRODUCING PEROVSKITE COMPOSITIONS

BACKGROUND OF THE INVENTION

This invention relates to a method and apparatus for producing perovskite compositions from precursor compositions using microwave heating in a crucible, capitalizing on the fact that perovskites are strong absorbers of microwaves and heat rapidly when irradiated with them.

"Perovskite" refers to a distorted orthorhombic crystal structure and to those complex oxide compositions such as $LaCrO_3$ having that crystal structure. Perovskite compositions include the following: $LaCrO_3$, $LaMnO_3$, $LaNiO_3$, $LaCoO_3$, $SrMnO_3$, $LaFeO_3$, $La_{1-x}Sr_xMnO_3$, $La_{1-x}Sr_xCrO_3$, $Y_{1-x}Ca_xCrO_3$, $LaCr_{1-x}Mg_xO_3$, $La_{1-x}Ca_xCrO_3$, $CaTiO_3$, $SrTiO_3$, $Sr_{1-x}La_xTiO_3$, $La_xSr_{1-x}Cr_yMn_{1-y}O_3$ ($0<x,y<1$) and others. High temperature 1-2-3 superconductors exhibit the perovskite structure. Particular applications for perovskite compositions include use in connection with chemical fuel cells, high temperature electrodes and chemical catalysis, and aerospace applications.

Perovskite compositions have been produced by heating stoichiometric mixtures of the precursors, but conventional methods are costly in terms of equipment, energy and processing time. They typically employ furnace temperatures in the range of from about 1250° C. to about 1475° C. for time periods ranging from about 11 hours to about 48 hours.

SUMMARY OF THE INVENTION

The present invention provides a method and apparatus for efficiently and economically producing perovskite compositions.

Briefly, therefore, the invention is directed to a method for producing a perovskite composition from a precursor composition wherein the precursor composition is irradiated with microwaves to heat the precursor composition and convert the precursor composition to perovskite.

The invention is further directed to a susceptor crucible for use in processing a perovskite precursor composition, the susceptor crucible having an inner crucible, an outer crucible surrounding the inner crucible, and a susceptor material positioned between and separating the inner and outer crucibles.

DETAILED DESCRIPTION OF THE INVENTION

Figure 1:
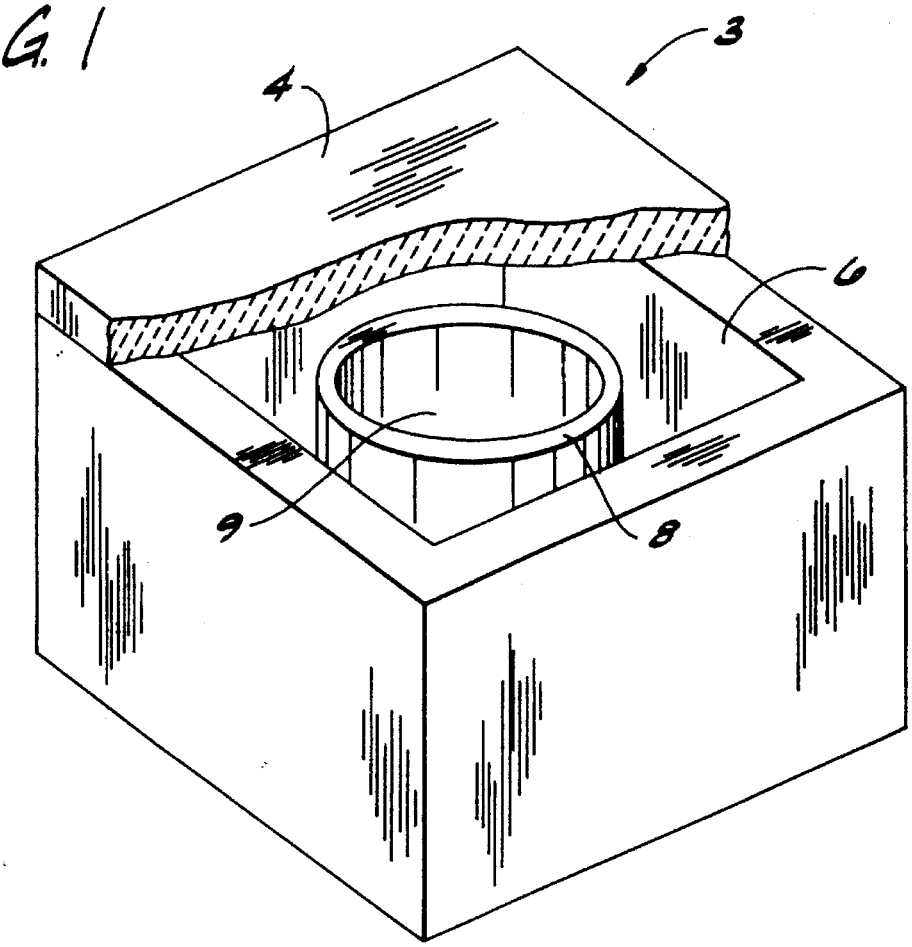
FIG. 1 is a perspective, partly in section, of the apparatus used in connection with the method of this invention.
Figure 2:
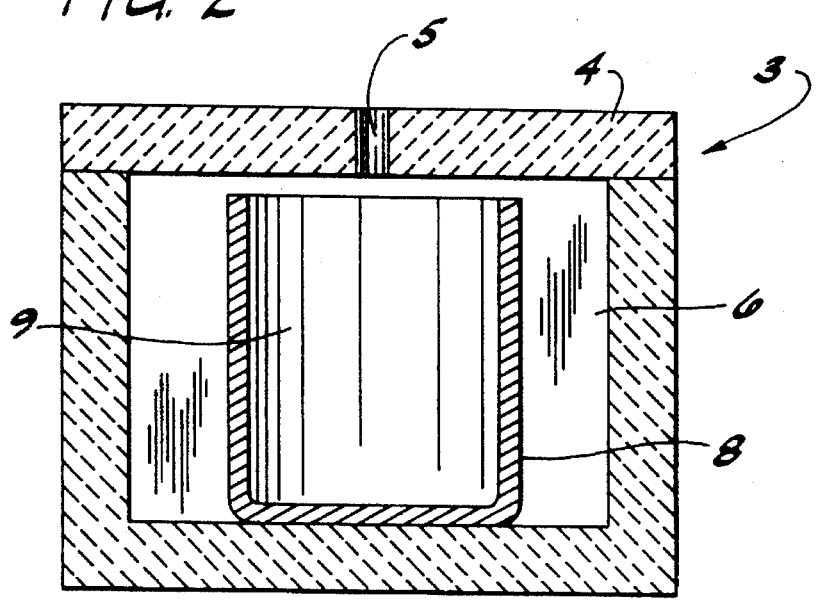
FIG. 2 is a side elevation in section of the apparatus used in connection with the method of this invention.

Turning now to FIGS. 1–2, illustrations of a preferred embodiment of the apparatus employed in this invention are presented. Ceramic housing 3 has four side walls and a bottom wall to define a chamber 6. Housing 3 is constructed from a material which does not absorb microwaves significantly, thus allowing the passage of microwaves into the chamber. Housing 3 also holds heat inside it and insulates the microwave oven into which it is placed, as described below, from heat emanating from within the chamber. The ceramic housing material preferably is resistant to thermal shock and has relatively low thermal conductivity. Housing 3 is preferably constructed of a high temperature fibrous ceramic alumina or zirconia microparticle material or a high temperature mullite or alumina ceramic board material such as Kaowool available from Babcock and Wilcox, Inc.

Lid 4 on housing 3 helps to maintain heat within chamber 6. Lid 4 is preferably constructed of the same or similar ceramic material as housing 3 and is removable to provide access to chamber 6. In an alternative embodiment, lid 4 is constructed of quartz or pyrex in order to allow observance of the interior of housing 3 during processing. Lid 4 is equipped with exhaust port 5 to allow gases to escape from chamber 6.

As also illustrated in FIGS. 1–2, within chamber 6 is crucible 8, which is a single-walled crucible constructed of zirconia, alumina or other material which is highly resistant to thermal shock. The interior 9 of crucible 8 is adapted for receiving and holding precursor compositions for processing in accordance with the method of the invention.

Figure 3:
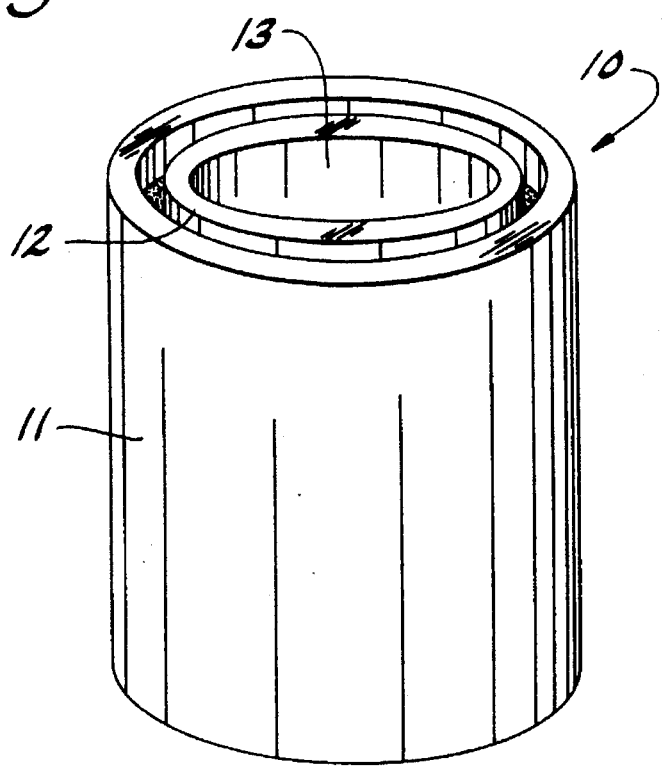
FIG. 3 is a perspective of the susceptor crucible of this invention.
Figure 4:
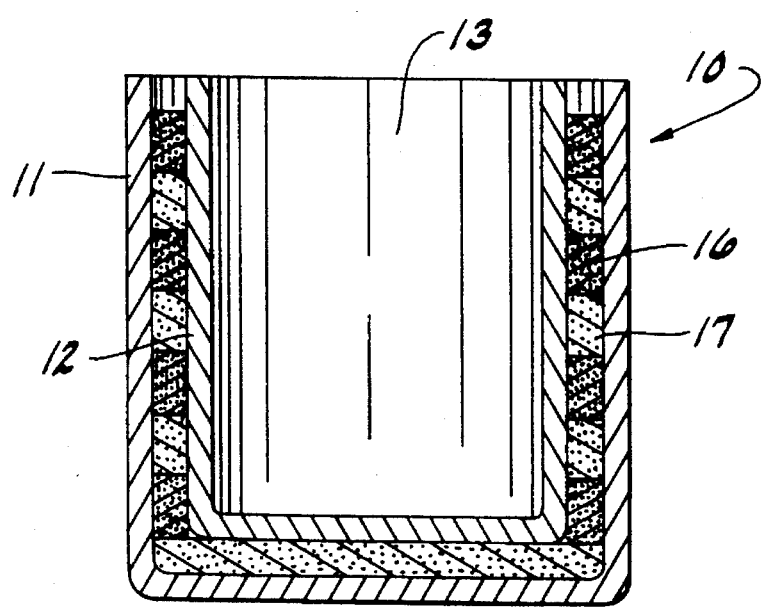
FIG. 4 is a side elevation in section of the susceptor crucible of this invention.

FIGS. 3–4 illustrate susceptor crucible 10 which is interchangeable, as described below, with crucible 8 of FIGS. 1–2. Crucible 10 is, more specifically, a susceptor crucible and comprises outer crucible 11 and inner crucible 12, both of which are constructed of zirconia, alumina or other material which is highly resistant to thermal shock. The interior 13 of inner crucible 12 is adapted for receiving and maintaining precursor compositions for processing in accordance with the method of the invention. Separating the inner and outer crucibles are alternating susceptor bands 16 and insulating bands 17 arranged as shown. Bands 16 and 17 extend around the complete circumference of the inner crucible. Susceptor bands 16 are composed of a microwave susceptor material, that is, a material having a high absorptive affinity for microwave radiation, and are preferably composed of a material having a perovskite crystal structure such as lanthanum chromite, lanthanum manganite, silicon carbide, molybdenum disilicide, or mixtures thereof. This microwave susceptor material is preferably in the form of whiskers, powder or granules of less than about 1 mm diameter. The susceptor bands absorb microwaves and transfer heat to the inner crucible, thus facilitating rapid heating of the crucible contents. Insulating bands 17 consist of an insulating material such as zirconia and are preferably in the form of powder or granules of less than about 1 mm diameter.

In accordance with the method of the invention, mixed precursors are heated using microwave energy to produce a composition having a perovskite crystal structure. This precursor composition is preferably in the form of a solid state oxide or carbonate powder or a sol-gel, for example, an isopropoxide-based sol-gel or an acetate-based sol-gel. Suitable sol-gels (i.e., metal oxide polymers) for use as precursor compositions can be prepared by mixing oxides in solution to form a sol and causing it to gel. Sol-gel processes are known in the art and are described, for example, by H. Taguchi et al. in "Synthesis of Perovskite-Type ($La_{1-x}Sr_x$)$MnO_3$ at Low Temperature," *J. of. Am. Ceram. Soc.*, 75 [1], 201–202 (1992), and by Tai et al. in "Modified Resin-Intermediate Processing of Perovskite Powders: Part I. Optimization of Polymeric Precursors," *J. Mater. Res.*, Vol. 7, No. 2 (February 1992), both incorporated by reference.

The precursor composition is processed by a method which employs only a single-walled crucible or by a method which employs both a susceptor crucible and a single-walled crucible. According to a preferred embodiment of the method of the present invention, a mass of precursor composition powder is placed in a single-walled crucible. A quantity of seed material, preferably in powder form, is placed in contact with the precursor composition, preferably by uniformly distributing the seed material on top of the precursor composition. The quantity of seed material will typically be about 2% to about 10% of the weight of the precursor composition. This seed material has an absorptive affinity for microwave radiation and is thus capable of absorbing microwaves and transferring heat to the precursor composition. It is preferred that the seed material have a perovskite crystal structure and that it have the same composition and stoichiometry as that material which is to be produced from heating of the precursor composition. The crucible containing the precursor composition is placed in the ceramic housing. Alternatively, the precursor composition may be placed in the crucible after placement of the crucible in the ceramic housing. The ceramic lid is closed, and the ceramic housing is placed in a microwave oven, such as a common 700 watt, 2.45 GHz household-type microwave oven. In certain instances, as in Example 1 herein, a ceramic or glass lid, which is preferably vented, is placed directly on the crucible and use of the ceramic housing is foregone.

The crucible contents can be irradiated with microwaves in the range of about 1 to 30 GHz. Certain precursor compositions respond better to microwaves of a particular frequency. Due to equipment availability, however, the selected microwave source preferably provides microwaves of about 2.45 GHz. The microwaves are absorbed by the perovskite seed material resulting in its being heated. The perovskite seed material transfers a quantity of heat to the precursor composition. Irradiation is continued for a period of time which varies depending on several factors, including the size of the crucible, the quantity and wavelength of the microwaves, the type of precursor material, the type of seed material, and the amount of precursor composition. Microwaves are generally directed at the crucible until the seed material glows orange, which usually takes at least about 15 seconds, preferably from about 15 to about 60 seconds, but the time will vary as the amount of precursor composition, conductivity of the precursor composition, and other factors change. At this point the seed material has absorbed sufficient microwave energy that it has initiated the process of heating the precursor composition and converting it to perovskite. Irradiation is interrupted and the precursor composition is stirred with a stainless steel spatula. Stirring facilitates uniform heating of the composition and formation of a uniform perovskite composition because it helps prevent the formation of isolated hot spots and off-setting of the composition stoichiometry prior to actual combination of the elemental components into the desired perovskite structure.

After stirring, irradiation of the crucible contents is resumed for additional periods ranging from about 1 to about 4 minutes separated by stirring. This heating and stirring sequence is repeated from about 3 to about 8 times. Irradiation with microwave energy is continued until the composition reaches a near white hot state, at which point the precursor composition is fully converted to the desired perovskite structure. Conversion to the desired perovskite structure is determined to be complete when the crucible contents, having been allowed to cool, are heated to an orange or white glow upon irradiation with microwaves for only a few seconds. The number of seconds a particular perovskite material takes to glow orange or white upon irradiation varies depending on the conductivity of the material. The perovskite material produced is preferably in the form of a powder, but may also be a solid body.

In another preferred embodiment of the method of the present invention, the precursor composition powder is placed in a susceptor crucible as shown in FIGS. 3–4, rather than a single-walled crucible. The susceptor bands absorb microwave energy and transfer heat to the crucible contents such that it is not necessary in certain instances to use perovskite seed material with the precursor composition. A susceptor crucible may therefore be used instead of, or in conjunction with, perovskite seed material for facilitating initial heating of the precursor composition. The precursor composition is subjected to one or more microwave periods. Where multiple microwave cycles are employed using a susceptor crucible, the cycles are separated by stirring. Once a minor portion of the precursor composition has partially or fully converted to microwave-absorbing perovskite structure, the susceptor crucible is no longer needed to absorb microwaves and heat the charge of precursor composition in the crucible, because part of the precursor composition itself absorbs microwave energy. Continued use of the susceptor crucible after the precursor composition has partially converted to perovskite composition is inefficient in that the susceptor material absorbs microwave energy which is preferably absorbed by the crucible contents rather than by the crucible itself.

After one or more microwave cycles using the susceptor crucible, its contents are transferred to a crucible such as the single-walled crucible 8 shown in FIG. 1. The precursor composition is then subjected to repeated microwave cycles separated by stirring until it reaches a near white hot state, at which point the precursor composition is fully converted to the desired perovskite structure.

In still another embodiment of the method of the invention, a dried precursor composition sol-gel is used instead of a precursor composition powder. The sol-gel is preferably fully dried such that organics introduced during sol-gel processing are removed. Drying may be accomplished by conventional oven or microwave techniques. Drying is continued until the sol-gel is non-sticky and at least partially charred.

The charred precursor composition sol-gel is placed in a crucible. The crucible is usually a single-walled crucible but in some instances it may be desirable to use a susceptor crucible, for example where the precursor has very little absorptive affinity for microwave radiation. The composition is irradiated with microwaves for a short period of time until volatiles remaining after the drying process are removed. The dry, charred composition is then irradiated with microwaves for a period of about 15 to 60 seconds followed by stirring. A small quantity of organics remaining in the charred sol-gel may assist the initial microwaving due to its absorptive affinity for microwaves. If the susceptibility to microwaves of the dry, charred sol-gel is very low, it may be desirable to use a quantity of perovskite seed material as described above. The composition is subsequently irradiated with microwaves for additional periods ranging from about 1 to about 4 minutes separated by stirring. This heating and stirring sequence is repeated from about 3 to about 8 times, or until the composition reaches a near white hot state, at which point the precursor composition is fully converted to the desired perovskite structure.

Particular embodiments of the invention have been described in connection with microwave irradiation using a microwave source set on 100% duty cycle. In certain instances, however, it is desirable to reduce the microwave duty cycle to less than 100%, for example, to 50%, 30%, 20% and even 10%, such that microwave irradiation is occurring significantly less than 100% of the time. Such reduction in duty cycle increases the total processing time, but does not necessarily increase the total irradiation time of the precursor composition.

The following examples illustrate the method of the invention.

EXAMPLE 1

About ten grams of spray-dried sol gel, prepared from nitrates of lanthanum, manganese and strontium using the polyacrylic acid method described in Taguchi et al., "Synthesis of Perovskite-Type ($La_{1-x}Sr$)$MnO_3$ at Low Temperature," *J. Am. Ceram. Soc.*, 75 [1]201–202 (1992), were placed in a single-walled crucible. A vented lid was placed on the crucible and the crucible was placed directly in a 700 watt, 2.45 GHz microwave oven. The crucible contents were irradiated with microwaves using the oven's high setting for between about 5 and 10 seconds. During this first microwave period, the crucible contents flashed to a fluffy atomic mixture of lanthanum, strontium and manganese oxides. This mixture of oxides was then partially mechanically packed and subsequently irradiated with microwaves for about 20 minutes using a 20% duty cycle. This 20 minute cycle was interrupted once at about 10 minutes for stirring of the crucible contents. The composition was removed from the crucible and verified by X-ray diffraction analysis as having a $La_{0.8}Sr_{0.2}MnO_3$ perovskite crystal structure.

EXAMPLE 2

Fifty grams of lanthanum, manganese and chromium oxide powder precursor composition were placed in a single-walled crucible. Five grams of $LaMn_{0.5}O_3$ perovskite powder seed material were uniformly distributed on top of the precursor composition. The crucible was placed in a ceramic housing, which was placed in a 700 watt, 2.45 GHz microwave oven. The crucible contents were irradiated with microwaves for 300 seconds. Irradiation was interrupted and the crucible contents were thoroughly stirred with a stainless steel spatula. The crucible contents were irradiated with microwaves for 4 minutes, and subsequently stirred. Microwave/stirring cycles were repeated 6 times, each for 4 minutes. The composition was removed from the crucible and verified by X-ray diffraction analysis as having perovskite crystal structure.

EXAMPLE 3

Fifty grams of lanthanum, strontium and manganese oxide powder precursor composition were placed in a susceptor crucible. The crucible was placed in a ceramic housing, which was placed in a 700 watt, 2.45 GHz microwave oven. The crucible contents were irradiated with microwaves for 300 seconds. The crucible contents were thoroughly stirred with a stainless steel spatula. The crucible contents were irradiated with microwaves for 4 minutes, and subsequently stirred. Irradiation was interrupted and the crucible contents were transferred to a single-walled crucible. The crucible contents were irradiated for 3 minutes, and were subsequently stirred. Microwave/stirring cycles were repeated 6 times, each for 2 minutes. The composition was removed from the crucible and verified by X-ray diffraction analysis as having a $La_{0.8}Sr_{0.2}MnO_3$ perovskite crystal structure.

EXAMPLE 4

Fifty grams of lanthanum, strontium and manganese carbonate powder precursor composition were placed in a susceptor crucible. The crucible was placed in a ceramic housing, which was placed in a 700 watt, 2.45 GHz microwave oven. The crucible contents were irradiated with microwaves for 300 seconds. The crucible contents were thoroughly stirred with a stainless steel spatula. The crucible contents were irradiated with microwaves for 4 minutes, and subsequently stirred. Irradiation was interrupted and the crucible contents were transferred to a single-walled crucible. The crucible contents were irradiated for 3 minutes, and were subsequently stirred. Microwave/stirring cycles were repeated 6 times, each for 2 minutes. The composition was removed from the crucible and verified by X-ray diffraction analysis as having perovskite a $La_{0.8}Sr_{0.2}MnO_3$ crystal structure.

Although specific examples of the present invention and its application are set forth it is not intended that they are exhaustive or limiting of the invention. These illustrations and explanations are intended to acquaint others skilled in the art with the invention, its principles, and its practical application, so that others skilled in the art may adapt and apply the invention in its numerous forms, as may be best suited to the requirements of a particular use.

I claim:

1. A method for producing a perovskite composition from a precursor composition comprising placing perovskite seed material in contact with the precursor composition and irradiating the seed material and the precursor composition with microwaves to heat the seed material and the precursor composition and convert said precursor composition to perovskite.

2. The method of claim 1 wherein said perovskite composition is selected from the group consisting of $LaCrO_3$, $LaMnO_3$, $LaNiO_3$, $LaCoO_3$, $SrMnO_3$, $LaFeO_3$, $La_{1-x}Sr_xMnO_3$, $La_{1-x}Sr_xCrO_3$, $Y_{1-x}Ca_xCrO_3$, $LaCr_{1-x}Mg_xO_3$, $La_{1-x}Ca_xCrO_3$, $CaTiO_3$, $SrTiO_3$, $Sr_{1-x}La_xTiO_3$, and $La_xSr_{1-x}Cr_yMn_{1-y}O_3$ wherein x and y are between 0 and 1.

3. The method of claim 1 wherein said precursor composition is a sol-gel composition.

4. The method of claim 1 wherein said precursor composition comprises a composition selected from the group consisting of lanthanum oxide, manganese oxide, chromium oxide, lanthanum carbonate, manganese carbonate and chromium carbonate.

5. The method of claim 1 wherein said microwaves have a duty cycle of less than 100%.

6. The method of claim 1 comprising interrupting the microwaves after irradiating the precursor composition for at least about 15 seconds, stirring the precursor composition, and resuming irradiation of the precursor composition.

7. The method of claim 6 wherein said resuming irradiation comprises irradiating the precursor composition with microwaves for at least about 3 irradiation periods, each such period ranging from about 1 to about 4 minutes.

8. A method for producing a perovskite composition from a precursor composition comprising:

placing the precursor composition in a susceptor crucible comprising an inner crucible, an outer crucible surrounding said inner crucible, and susceptor material positioned between and separating said inner and outer crucibles;

irradiating said precursor composition with microwaves so that the susceptor material absorbs microwaves to transfer heat to the precursor composition and at least partially convert at least a portion of the precursor composition to perovskite.

9. The method of claim 8 comprising the additional step of transferring the irradiated precursor composition to a second crucible which does not comprise susceptor material and irradiating the precursor composition in the second crucible with microwaves to convert the precursor composition to perovskite.

10. The method of claim 9 wherein said perovskite composition is selected from the group consisting of $LaCrO_3$, $LaMnO_3$, $LaNiO_3$, $LaCoO_3$, $SrMnO_3$, $LaFeO_3$, $La_{1-x}Sr_xMnO_3$, $La_{1-x}Sr_xCrO_3$, $Y_{1-x}Ca_xCrO_3$, $LaCr_{1-x}Mg_xO_3$, $La_{1-x}Sr_xMnO_3$, $La_{1-x}Ca_xCrO_3$, $CaTiO_3$, $SrTiO_3$, $Sr_{1-x}La_xTiO_3$, and $La_xSr_{1-x}Cr_yMn_{1-y}O_3$ wherein x and y are between 0 and 1.

11. The method of claim 10 wherein said perovskite composition is $La_{0.8}Sr_{0.2}MnO_3$.

12. The method of claim 8 wherein said precursor composition comprises a composition selected from the group consisting of lanthanum oxide, manganese oxide, chromium oxide, lanthanum carbonate, manganese carbonate and chromium carbonate.

13. The method of claim 8 wherein said microwaves have a duty cycle of less than 100%.

14. A susceptor crucible for use in processing a perovskite precursor composition comprising:

an inner crucible;

an outer crucible surrounding said inner crucible; and a susceptor material positioned between and separating said inner and outer crucibles.

15. The susceptor crucible of claim 13 wherein said susceptor material has a perovskite crystal structure.

16. A method for producing a perovskite composition from a precursor composition comprising irradiating the precursor composition with microwaves to heat the precursor composition and convert said precursor composition to perovskite, said precursor composition being a precursor composition for a perovskite composition selected from the group consisting of $LaCrO_3$, $LaMnO_3$, $LaNiO_3$, $LaCoO_3$, $SrMnO_3$, $LaFeO_3$, $La_{1-x}Sr_xMnO_3$, $La_{1-x}Sr_xCrO_3$, $Y_{1-x}Ca_xCrO_3$, $LaCr_{1-x}Mg_xO_3$, $La_{1-x}Ca_xCrO_3$, $CaTiO_3$, $SrTiO_3$, $Sr_{1-x}La_xTiO_3$, and $La_xSr_{1-x}Cr_yMn_{1-y}O_3$ wherein x and y are between 0 and 1.

17. A method for producing a perovskite composition from a precursor composition comprising placing perovskite seed material in contact with the precursor composition and irradiating the seed material and the precursor composition with microwaves to heat the seed material and the precursor composition and convert said precursor composition to perovskite, said perovskite seed material having the same composition as the perovskite composition produced from the precursor composition, said perovskite composition being selected from the group consisting of $LaCrO_3$, $LaMnO_3$, $LaNiO_3$, $LaCoO_3$, $SrMnO_3$, $LaFeO_3$, $La_{1-x}Sr_xMnO_3$, $La_{1-x}Sr_xCrO_3$, $Y_{1-x}Ca_xCrO_3$, $LaCr_{1-x}Mg_xO_3$, $La_{1-x}Ca_xCrO_3$, $CaTiO_3$, $SrTiO_3$, $Sr_{1-x}La_xTiO_3$, and $La_xSr_{1-x}Cr_yMn_{1-y}O_3$ wherein x and y are between 0 and 1.

* * * * *

UNITED STATES PATENT AND TRADEMARK OFFICE
CERTIFICATE OF CORRECTION

PATENT NO. : 5,462,009
DATED : October 31, 1995
INVENTOR(S) : Darryl F. Garrigus It is certified that error appears in the above-indentified patent and that said Letters Patent is hereby corrected as shown below:

Column 8, line 3, "claim 13" should read --claim 14--.

Signed and Sealed this

Fifteenth Day of October, 1996

Attest:

BRUCE LEHMAN

Attesting Officer        Commissioner of Patents and Trademarks